United States Patent [19]
Crotti

[11] Patent Number: 5,279,982
[45] Date of Patent: Jan. 18, 1994

[54] METHOD FOR FABRICATING MEMORY CELL MATRIX HAVING PARALLEL SOURCE AND DRAIN INTERCONNECTION METAL LINES FORMED ON THE SUBSTRATE AND TOPPED BY ORTHOGONALLY ORIENTED GATE INTERCONNECTION PARALLEL METAL LINES

[75] Inventor: Pier L. Crotti, Landriano, Italy

[73] Assignee: SGS-Thomson Microelectronics s.r.l., Italy

[21] Appl. No.: 734,503

[22] Filed: Jul. 23, 1991

[30] Foreign Application Priority Data

Jul. 24, 1990 [IT] Italy ............... 83627 A/90

[51] Int. Cl.$^5$ .................................. H01L 21/265
[52] U.S. Cl. .................................. 437/48; 437/49; 437/43
[58] Field of Search ............ 437/43, 48, 52, 192, 437/235; 357/23.5; 365/185

[56] References Cited

U.S. PATENT DOCUMENTS

| | | | |
|---|---|---|---|
| 4,271,421 | 6/1981 | McElroy | 357/41 |
| 4,597,060 | 6/1986 | Mitchell et al. | 365/185 |
| 4,849,369 | 7/1989 | Jeuch et al. | 437/43 |
| 4,957,881 | 9/1990 | Crotti | 437/235 |
| 5,120,571 | 6/1992 | Gill et al. | 437/43 |

FOREIGN PATENT DOCUMENTS

| | | |
|---|---|---|
| 0258141A1 | 3/1988 | European Pat. Off. |
| 0364769A2 | 4/1990 | European Pat. Off. |
| 0436475A2 | 7/1991 | European Pat. Off. |

OTHER PUBLICATIONS

Kuniyoshi Yoshikawa et al., "An Asymmetrical Lightly Doped Source Cell for Virtual Ground High-Density EPROM's," *IEEE Transactions on Electron Devices* 37(4): 1046-51, Apr. 1990.

Primary Examiner—Olik Chaudhuri
Assistant Examiner—H. Jey Tsai
Attorney, Agent, or Firm—Seed and Berry

[57] ABSTRACT

A cell array for EPROM or ROM type memories has drain and source interconnection metal lines connecting in common drain and source regions, respectively, of the cells arranged on a same row of the array formed directly on the semiconductor substrate, superimposed at crossings to uninterrupted isolation strips formed on the semiconductor substrate for separating cells belonging to two adjacent columns of the array, and gate interconnection lines (WORD LINES), connecting the control gate electrodes of cells arranged on a same column, which run parallel to and between said isolation strips and superimposed at crossings to said underlying source and drain lines (BIT LINES). The array is markedly more compact than an array made according to the prior art though utilizing fabrication apparatuses with similar optical resolution, while maximizing the source and drain contact areas of the cells. In ROM devices, the customizing may advantageously take place during the final steps of the fabrication process by means of a gate contact mask having a reduced criticality in respect to a comparable drain contact mask used in prior art processes. The fabrication process employs self-alignment techniques and masks with a relatively low alignment criticality.

17 Claims, 3 Drawing Sheets

METHOD FOR FABRICATING MEMORY CELL MATRIX HAVING PARALLEL SOURCE AND DRAIN INTERCONNECTION METAL LINES FORMED ON THE SUBSTRATE AND TOPPED BY ORTHOGONALLY ORIENTED GATE INTERCONNECTION PARALLEL METAL LINES

BACKGROUND OF THE INVENTION

1. Field of the Invention

The present invention relates to an integrated semiconductor device containing an array of memory cells with markedly reduced chip's area requirements and wherein the need to form individually contacts on the drain area of all the cells is eliminated. The invention relates also to a process for fabricating such a memory device.

2. Description of the Prior Art

Monolithically integrated devices and memories using cells formed substantially by a MOS transistor (often a floating gate transistor) are well known and largely used in modern digital technologies. These semiconductor devices are characterized by the presence of one or more matrices of memory cells, either in the form of simple transistors and/or of floating gate type EPROM cells, organized in an array of rows and columns and which may be individually addressed by means of an appropriate selection circuitry.

Frequently in the case of EPROM memories, each cell may be essentially formed by a floating gate (or double gate) MOS transistor. The conventional architecture of these arrays of memory cells which is characterized by the presence of parallel interconnection lines for the individual drain contacts of the transistors (cells) of each column and which are oriented orthogonally with respect to the parallel gate lines is similarly well known. The source regions of a pair of adjacent transistors along a column are electrically in common and, according to a conventional arrangement, the pairs of source regions in common of the transistors (cells) disposed along the same row are electrically connected in common through the semiconducting silicon substrate. In these known devices the isolation structures which separates the drains and the gates of pairs of cells disposed on the same row have a substantially rectangular geometry, whether being formed in trenches cut into the semiconductor (e.g. BOX type isolations) or formed by thermally growing a thick layer of field oxide in purposely defined by means of a nitride mask isolation zones. Commonly the drain contacts are formed through a masking step followed by the etching of a dielectric layer deposited on the surface of the semiconductor wafer for isolating the gate lines (i.e. the control gate structures of the transistors) which have already been formed From the point of view of photolithographic definition of increasingly small features, the above mentioned topographical arrangements of the conventional architecture of these devices have the following drawbacks.

Isolation Mask (or Active Areas Mask). The geometries, though perfectly rectangular on the master mask, inevitably show rounded corners when reproduced on wafer. This depends essentially from optical diffractive limits of the imagine systems. The latent image in the resist layer of the projected geometries already shows a rounding of corners, a rounding which further increases through the following developing process.

With high resolution optical apparatuses (e.g. with a N.A.>0.45) and with a high contrast masking process, the phenomenon may be limited but persists. At present, the best result which may be obtained are corners with a radius of curvature of about a quarter of micrometer. This value increases when thermally growing a field oxide.

The rounding of corners of rectangular geometries determines an increased criticality of the alignment of the gate lines above and a certain dimensional variance of the channel width of the devices.

Contact Mask. The photolithographic problems are the known ones relating to the alignment in respect to the existing layers and to the rounding (which is here even more marked) of the corners of the geometries with a consequent reduction of the real contact area. Moreover the attendant reduction of the cross sectional area of the etched contact holes implies remarkable technological difficulties for adequately "filling" these submicrometric cavities with a metal.

In the prior U.S. patent application No. 07/632,101, filed on Dec. 20, 1990, of the same assignee, a memory device was described wherein the above mentioned technical problems were substantially overcome while permitting the achievement of a higher degree of compactness of the memory cell. This was obtained by forming continuous isolation strips instead of discontinuous strips implying a rectangular geometry and by attaining the connection in common of the source regions by means of metal interconnect lines formed in a self-alignment manner directly over the semiconductor substrate in the source areas and above the isolation strips at crossings with the latter. The general configuration was that of a device with source connection lines extending parallel to, and between, gate lines, while individual drain contacts were formed in a selfalignment manner on the respective drain areas between two adjacent isolation strips. The drain interconnection lines could then be formed in a conventional manner for connecting the drain areas belonging to unit cells of the same column. In other words, also according to this solution, the drain connection lines for connecting the individual drain contacts formed on the respective drain areas of the single cells run over the gate lines and were formed during relatively last phases of the fabrication process.

In the quest for devices ever more compact wherein submicrometric features must be defined by photolithographic methods, there is the need for further reducing the criticality of masking steps in terms of freedom from severe mask alignment tolerances, or more generally for simplifying the fabrication process with an ultimate objective of ensuring a high reliability and yield also in the case of devices designed for the most advanced limits of integration.

SUMMARY OF THE INVENTION

Object of the present invention is an integrated device comprising an array of memory cells, wherein the presence of individual drain contacts is substantially eliminated and which therefore may be fabricated with a relatively high compactness by means of less critical procedures than those followed in known fabrication processes, i.e. with a marked simplification of the fabrication process which has positive reflects on the process's yield, reliability of the devices produced as well as on fabrication costs.

Also in the device of the present invention, as already in the device object of the cited prior patent application, the isolation structure is formed by parallel isolation strips, without which extend interruptions for the entire column's length of the array of cells, which are organized in rows and columns. This fact, as already described in said prior patent application, permits the attainment of a markedly increased compactness degree while utilizing apparatuses for photolithographic definition with uncharged optical resolution, because the active cell areas are defined by means of the same minimum definition distance of the process, i.e. the so-called gate lines "minimum strip's width". The relevant description contained in said prior U.S. patent application No. 07/632,101, is herewith incorporated by express reference.

By contrast, in the device of the present invention, the relative positions of the gate lines (WORD LINE) and of the drain lines (BIT LINES) are essentially inverted with respect to those which were respectively occupied in the device object of the cited prior patent application, as well as in the great majority of the devices of the prior art.

In particular, as opposed to the structure disclosed in the cited prior patent application, the gate interconnection lines (i.e. control gate lines or WORD LINE) extend in an orthogonal direction in respect to the direction of extension of the source and of the drain interconnection lines, thus running parallel to the isolation strips in the direction of extension of the "columns" of the array of cells.

Contrary to the large majority of the prior art devices, in the device object of the present invention, the gate interconnection lines, run above the drain interconnection lines, by practically inverting the order of superimposition of the relative layers which are formed in succession on the semiconductor wafer. Such a "superimposition" of the gate lines permits the realization of a connection in common of the drain junction belonging to cells which are arranged along a same row of the array by means of a drain connection line which is formed directly on the surface of the semiconducting substrate, above and in contact with the drain areas, and spatially superimposed to the isolation strips in cross over zones with the latter. In this way, the need of individual drain contacts in each cell, the formation and reliability of which present some of the major technological problems, in accordance with the present techniques of manufacture, is substantially eliminated.

The electrical interconnection between drain regions of the single cells may therefore be implemented by forming, in a self-alignment manner, substantially continuous metal lines, thus eliminating in large measure, the above mentioned difficulties of photolithographic definition, as well as the problems connected to clean the minuscule contact areas, beside ensuring a real drain contact area which is markedly larger than that which could be obtained by the known techniques and therefore a greater realiability and quality of the ohmic contact which is established in respect to the prior art. Additional advantages are achieved in terms of eliminating the need to recur to ion implantation of the contact area after having defined it, of the so-called traditional METAL mask, as well as in terms of allowing the formation of gate contacts on a remarkably flat structure. This last aspect of the device of the invention further contributes to make the device particularly suited for implementing also ROM type devices, which may be programmed (customized) by creating or not MOS transistors within a "mosaic" of cells, by means of a so-called GATE CONTACTS mask, which may advantageously be used during one of the last phases of the fabrication process and under relatively noncritical conditions.

BRIEF DESCRIPTION OF THE DRAWINGS

The different features and advantages of the invention will become evident through the following detailed description of certain embodiments of the invention and by reference to the annexed drawings, wherein.

the series of Figures from 1 to 11 schematically depicts the device architecture by illustrating the principal steps of the fabrication process, according to a first embodiment.

DESCRIPTION OF PREFERRED EMBODIMENTS

With reference to FIGS. 1 to 11, on a semiconducting substrate 1, isolation structures 2 are defined and formed as uninterrupted parallel strips, which extend for the entire height of the columns of the array of cells. The isolation structures 2 may be constituted by a field oxide layer, thermally grown on unmasked portions of the surface of the semiconductor 1 which may have previously been ion implanted, according to one of the well known techniques of masking with silicon nitride, as the so-called LOCOS technique (by Philips) or the PLANOX technique (by SGS-THOMSON) or alike. Alternatively the isolation strips may be "inlaid", i.e. made by first cutting trenches on the surface of the semiconducting substrate which, after an ion-implantation, are filled by deposition with a dielectric material such as silicon oxide (BOX type isolations), thus advantageously ensuring a perfect planarity of the surface of the wafer.

Figure 1:
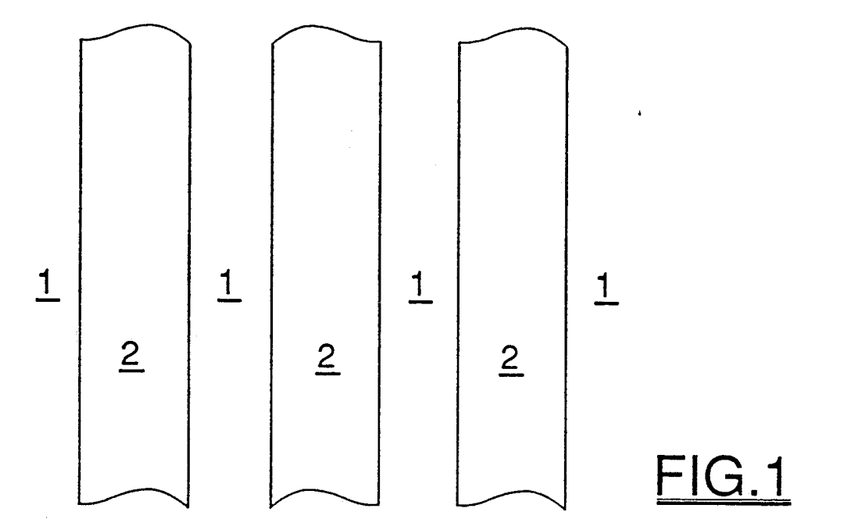

As it may be observed the photolithographic definition of the isolation strips 2 is practically free of the inconveniences which derived by the rounding, during the image transfer process, of the corners of substantially rectangular geometries, such as was the case with the known prior art architecture of these devices. The photolithographic definition of parallel strips is far more easy, optically, because the diffraction problems are markedly less pronounced than in the case of rectangular or bi-directionally defined features.

After having formed the isolation structures 2 by utilizing any of the known techniques, also by following common practices, the gate structures, indicated with 3 as a whole, are formed, which gate structures, in accordance with the present invention, are partially sacrificial structures because they will be further defined later in the process by further masking and etching. As it may be observed in FIG. 2, the gate structures for an array of unit memory cells are, at this stage, parallel spaced strips, which intersect orthogonally the isolation strips 2 previously formed on the front of the semiconducting wafer by crossing over them. As shown in the cross sectional view A—A of FIG. 3, for the specific case of EPROM type cells, each individual gate structure comprises a first conducting layer 4, usually of polycrystalline silicon (poly I), which is electrically isolated from the underlying semiconductor 1 by a gate dielectric layer, normally of silicon oxide, 5, previously formed over the active areas between two adjacent isolation strips 2, and which first conducting layer 4 will constitute the floating gate of the EPROM cells of the device, completely insulated by a dielectric layer or multilayer 6, on top of which a second conducting layer of polycrystalline silicon (poly II) 7 is deposited and patterned to constitute a control gate electrode of the cell. The flanks of the composite gate structures 3 are covered by an insulating dielectric layer 8, having a tapered cross sectional profile for forming lateral spacers for conducting the subsequent ion implantation of the drain and source areas of the semiconductor and for forming, in a selfalignment condition, electrical interconnection lines for the drain and source regions of individual cells, as will described later. Also the formation of these tapered dielectric spacers 8 is a well known practice and therefore will not be reiterately described in detail.

Briefly, the fabrication process after having completed the formation of isolation structures in the form of parallel uninterrupted strips 2, in the case of an EPROM memory, may comprise the following steps:

a) thermally oxidizing the semiconductor 1 to form a layer of gate oxide 5 on active areas;

b) depositing by chemical vapor deposition a layer of polycrystalline silicon (poly I) and doping it;

c) forming by thermally oxidizing the surface of the deposited polycrystalline silicon, or by deposition, a dielectric layer or multilayer 6 for isolating the floating gate constituted by the patterned layer of polycrystalline silicon 4 (poly I);

d) depositing by chemical vapor deposition a second layer of polycrystalline silicon 7 (poly II), through which the control gates will be patterned eventually, and optionally also a layer of silicon silicide in order to complete in practice the deposition step of all the layers which form the gate structure stack of the memory matrix;

e) patterning by masking and etching the parallel lines of the gate structure;

f) forming side wall spacers 8 of a dielectric material on the flanks of the lines of the gate structure, and implanting source and drain areas according to common practices.

Figure 2:
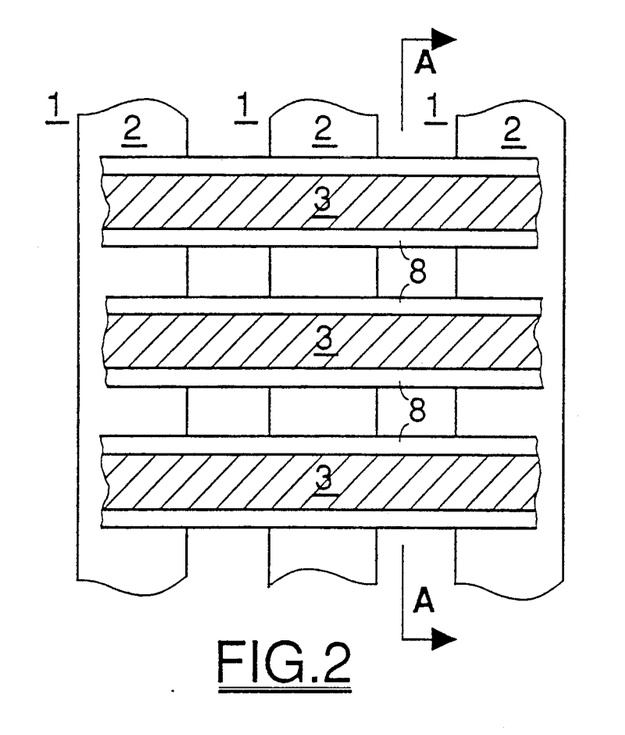
Figure 3:
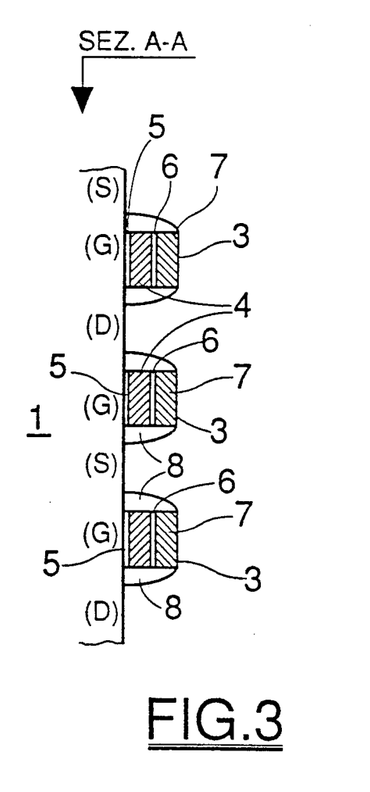

At the end of this sequence of fabrication steps, the structure is as shown in FIGS. 2 and 3, in particular in the sectional view of FIG. 3, a gate structure for EPROM cell is depicted. Of course, in case of cells formed by a simple MOS transistor, the gate structure will comprise a single conducting layer (i.e. the gate structure will be formed substantially by the poly I layer only).

At this point the fabrication process may proceed in accordance with two different embodiments of the invention.

Figure 4:
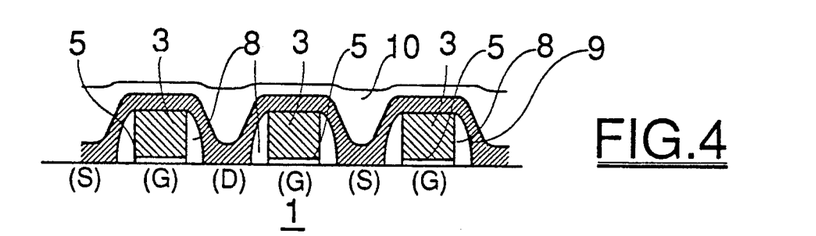
Figure 5:
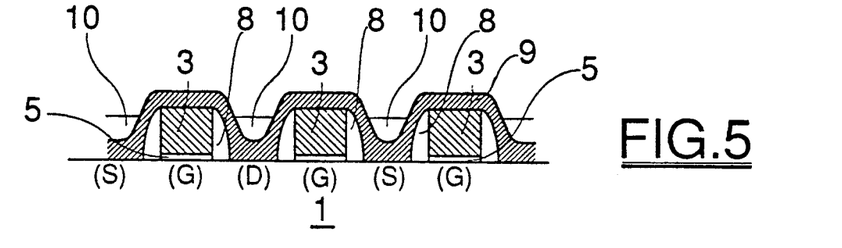
Figure 6:
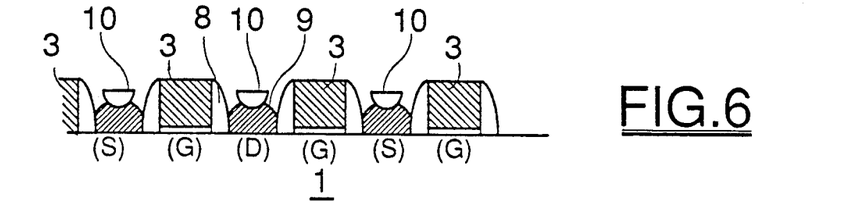

According to a first embodiment, which is schematically depicted in the series of FIGS. 4-11, the process proceeds through the following steps:

g) conformally depositing a single, electrically conducting, matrix layer 9 or a conducting multilayer, followed by the deposition of a layer of a planarizing material 10 (e.g. a silicon oxide glass; SOG) or of a material which lend itself to be planarized (e.g. a mixture of oxides which may be thermally reflown), as depicted in FIG. 4;

h) maskless "blanket" etching of the layer 10 until exposing the tops of the peaks of the underlying matrix conducting layer 9 which was previously deposited, as shown in FIG. 5;

i) selective etching of the conducting material of the matrix layer 9, exposed during the preceding etching step, while utilizing the residues of the planarizing material 10 as a mask during this etching step, until lowering the etch front of the conducting material down the sides of the dielectric spacers 8, as shown in FIG. 6.

With this last step, the source and drain interconnection lines are jointly formed directly on the substrate, above source and drain regions of the cells, respectively, which lines geometrically cross-over the isolation strips when they cross with the latter which extend in an orthogonal direction in respect to said connection lines. It is evident as the contact area on the source regions as well as on the drain regions is advantageously as large as possible. Moreover, the fact that the electrical contact is established on an area of the semiconducting substrate which has not been purposely "exposed" by means of an etching of an isolation dielectric layer which is customarily formed for isolating the gate structures, avoids the problems due to etch induced crystal defects and/or implantation of polluting species and/or to an imperfect or only partial cleaning of the contact area from oxide and/or polymeric residues which normally are formed during the customary Reactive Ion Etching process used for making the contact holes through an isolating dielectric layer. Of course, the most remarkable advantage is represented by the fact that the drain and source connection metal lines are realized without the use of patterning masks whose alignment could be critical. In fact, the metal source and drain connection lines 9 are formed in a substantially self-alignment manner in respect to the existing, partially sacrificial, gate structures, which at this stage are still in the form of uninterrupted parallel strips.

Figure 7:
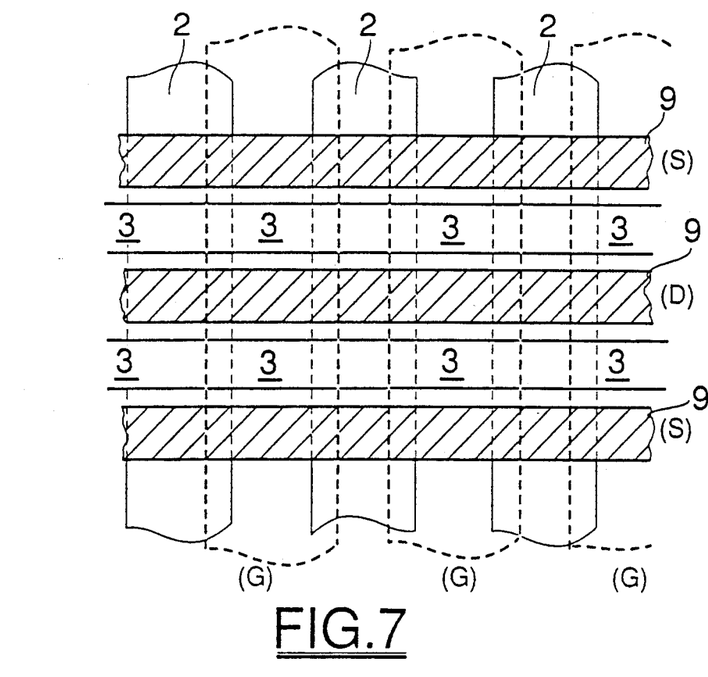
Figure 8:
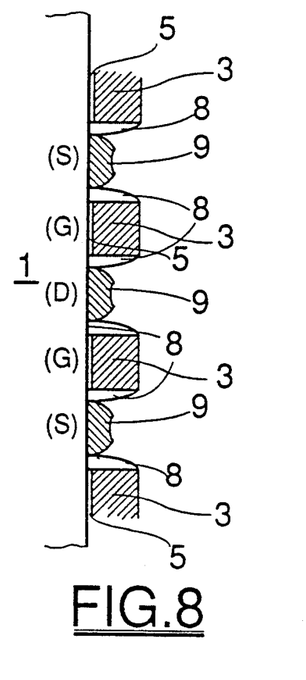
Figure 9:
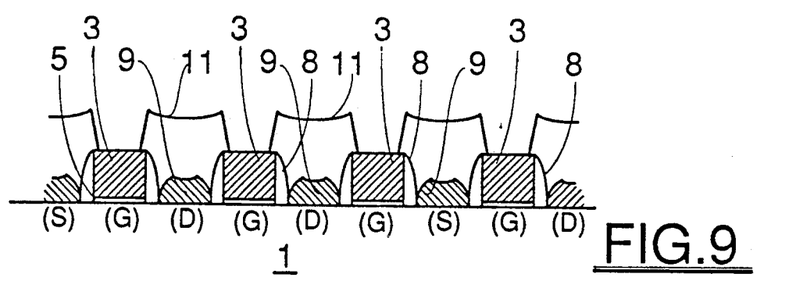

At this point, the fabrication process may proceed further through the following steps:

j) removing the residual strips of planarizing material 10 still present over the conducting lines 9, applying a layer of resist and defining a GATE SEPARATION MASK, whose pattern is schematically shown in FIG. 7 by the profiles G drawn with a dash line. As it is easily observed, this mask has a pattern formed by parallel strips and is substantially free of critical features. Etching through the openings of the mask the unmasked portions of the partially sacrificial gate structure, i.e. of the strips 3 where they cross over the underlying isolation strips, thus interrupting the continuity of the strips of the partly sacrificial gate structure which was formed and defining the permanent gate structures of the single cells, as depicted in FIGS. 7 and 8;

k) depositing a layer of dielectric material 11 as intermediate isolation layer, l) defining by means of a dedicated GATE CONTACT mask and etching the layer of dielectric material 11 of intermediate isolation until exposing the surface of the conducting layer of the patterned control gate of EPROM cells or of the unique gate conducting layer in the case of normal MOS transistors, as depicted in FIG. 9.

This GATE CONTACT mask is appreciably far less critical than the mask normally used for "opening" the drain contacts in prior art architectures. In fact, the surface to be exposed for the contact is at a relatively higher and constant level on the front of the wafer, which front, after depositing the intermediate isolation dielectric layer 11, is relatively flat and may easily be further planarized if needed.

Figures 10, 11:
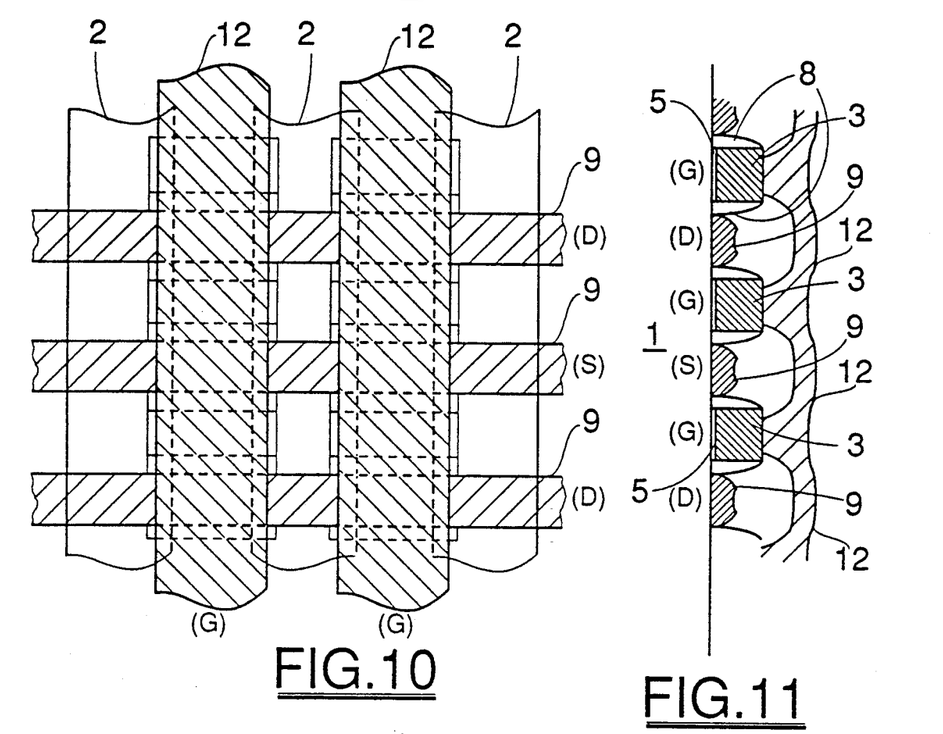

The fabrication process may then proceed through the following steps:

m) depositing a conducting layer (doped polycrystalline silicon, aluminum, aluminum alloy and the like) and patterning by means of dedicated mask the gate connection lines 12, which are lines parallel to each other and orthogonal in respect to the underlying source and drain connection lines and run projectively parallel to two underlying adjacent isolation strips, as shown in FIGS. 10 and 11.

Figure 12:
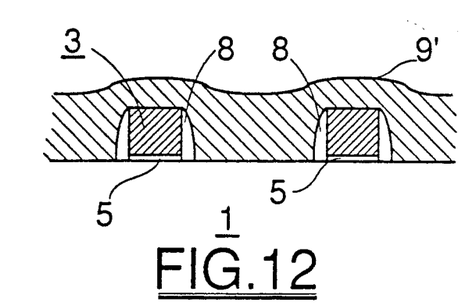
FIGS. 12 and 13 schematically show an alternative embodiment of the invention.

According to an alternative embodiment of the invention, it is possible to form the source and drain connection lines by depositing above the patterned, partially sacrificial strips of the gate structure 3, a layer of conducting material (e.g. tungsten), not in a conformal manner, but in such a way that the deposited layer of conducting material substantially planarizes the surface of the front of the wafer, as depicted in FIG. 12. This may be obtained by utilizing techniques which favor the tendency of the specific metallic material deposited to readily fill the cavities of the surface by growing thicker therein rather than on the top of the peaks of the surface.

Figure 13:
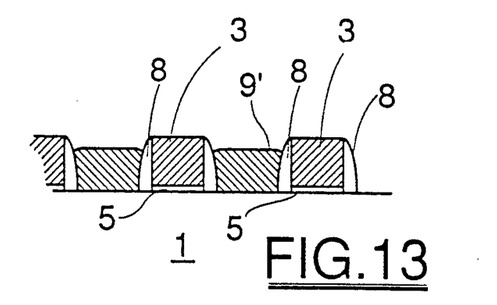

Such a planarizing conducting layer 9' may than be etched under highly anisotropic conditions, e.g. by a RIE etch process, until the etch front of the conducting material 9' is lowered down the sides of the dielectric spacers 8 which are present on the flanks of the underlying strips 3 of the gate structure, as schematically depicted in FIG. 13, in order to form in a simplified manner the drain and gate metallic connection lines, self-aligned to the existing strips 3 of the gate structure.

While in FIG. 3 a typical composite stack gate structure of an EPROM cell has been shown in detail, in the following Figures the gate structure has been more generally indicated with 3, as a whole, purposely without showing the intrinsic specific multilayered structure, because as it will be evident to the skilled technician, the present invention is equally applicable both in the case of EPROM type unit cells, as well as in the case of unit cells formed by a standard MOS transistor or alike structure, i.e. having a single gate electrode. The so-called ROM memories are normally made with such a type of unit cells which cannot be erased (neither programmed) solely by electrical means. The discrimination between the status "1" and "0" of the binary code is conventionally implemented by either one of the following methods:

a) by creating (or not creating) a transistor structure in a particular location of the array (matrix) of transistors;

b) by differentiating by means of channel implantation, the switch-on threshold of a particular transistor of the array;

c) by connecting (or not connecting) a particular transistor of the array.

The latter technique is often preferred because it permits to "customize" a device advantageously during the terminal steps of the fabrication process so as to permit standardization of the greater part of the preceding fabrication steps. According to known techniques, this customization may occur by connecting each drain to two selectable channels. The advantage of such an architecture is given by a 100% redundancy, while the drawback is the requirement for a relatively large area of silicon. The lithographic difficulties are practically the same which are encountered when fabricating EPROM type cells.

By contrast, the present invention allows the implementation of a "programmed" connection of each transistor of the memory array during the terminal steps of the fabrication, by means of the gate contact mask and this fact greatly reduces the criticity of alignment and patterning in respect to the prior art practice of employing for the same purpose a far more critical DRAIN CONTACT mask, as mentioned before. Advantageously each transistor or memory cell may be addressed through two selectable channels thus obtaining the same 100% redundancy as in the case of the prior art, while taking advantage of the extreme compactness of the array of the invention, in respect to an array made according to the prior art.

In more general terms, or in particular in the case of EPROM memory arrays, different decoding circuits may be used which would include or not a certain redundancy. In other words, in case single memory cells are to be individually addressed, the memory matrix must be provided with an appropriate decoding circuitry for discriminating among the source lines, in accordance with a well known technique. By contrast if a more traditional decoding circuitry is utilized, with all the source lines electrically connected in common, each memory "cell" must be considered as formed in practice by two half cells, i.e. by a pair of unit cells or of transistors of the memory array, which will act in conjunction to each other thus determining a 100% redundancy, according to well known practices.

What I claim is:

1. A process for fabricating a semiconductor device comprising an array of memory cells, each having a gate structure formed above a channel region between a source and a drain region of a semiconducting substrate, organized in rows and columns with source, gate and drain electrical interconnection lines and with an isolation structure comprising parallel isolating strips which extend uninterruptly for the whole columnwise length of said array of cells and separate a cell from an adjacent cell disposed on the same row, which comprises the following steps forming an isolation structure among the cells of a row of said array in the form of uninterrupted isolation strips uniformly spaced and parallel to each other and extending for the whole columnwise length of said array;

forming a partially sacrificial gate structure in the form of spaced parallel strips running orthogonally to said underlying isolation strips and forming dielectric sidewall spacers along the flanks of said partially sacrificial gate structure strips;

conformally depositing a metal layer or multilayer over said substrate and strips;

depositing a layer of planarization material;

anisotropically etching without a mask said layer of planarization material until exposing the tops of the underlying conformally deposited metal layer, thus leaving residual ribbons of said planarization material on the bottom of valleys of said metallic layer between two underlying partially sacrificial adjacent strips of said gate structure;

etching the exposed portions of said metal layer utilizing said residual ribbons of planarization material on the bottom of said valleys as a mask, until lowering the etch front of the metal of said layer down the side walls of said dielectric spacers formed along the flanks of said partially sacrificial strips of the gate structure;

removing said residual ribbons of planarization material;

forming a gate-separation mask having openings coinciding with the superimposition zones of said partially sacrificial gate structure strips over said underlying isolation strips;

etching the exposed portions of said partially sacrificial gate structure strips for defining permanent gate structures and successively removing said mask;

depositing an intermediate isolation layer of a dielectric material;

defining by means of a gate-contact mask individual gate contacts and etching said intermediate isolation dielectric material layer through openings of the mask until exposing the top surface of said permanent gate structures and removing said mask;

depositing a gate-contact metal layer in electrical contact with said permanent gate structures and patterning said deposited metal layer to form said gate interconnection lines parallel to the underlying isolation strips and orthogonal to said underlying drain and source interconnection lines and connecting the gate structures of the cells of a column of the array.

2. A process for fabricating a semiconductor device comprising an array of memory cells, each having a gate structure formed above a channel region between a source and a drain region of a semiconducting substrate, organized in rows and columns with source, gate and drain electrical interconnection lines and with an isolation structure comprising parallel isolating strips which extend uninterruptly for the whole columnwise length of said array of cells and separate a cell from an adjacent cell disposed on the same row, which comprises the following steps forming an isolation structure among the cells of a row of said array in the form of uninterrupted isolation strips uniformly spaced and parallel to each other and extending for the whole columnwise length of said array;

forming a partially sacrificial gate structure in the form of spaced parallel strips running orthogonally to said underlying isolation strips and forming dielectric sidewall spacers along the flanks of said partially sacrificial gate structure strips;

depositing a planarizing metal layer over said substrate and strips;

anisotropically etching without a mask said layer of planarizing metal layer until lowering the etch font of said planarizing metal layer down the side walls of said dielectric spacers formed along the flanks of said partially sacrificial gate structure strips;

forming a gate-separation mask having openings coinciding with the superimposition zones of said partially sacrificial gate structure strips over said underlying isolation strips;

etching the exposed portions of said partially sacrificial gate structure strips for defining permanent gate structures and successively removing said mask;

depositing an intermediate isolation layer of a dielectric material;

defining by means of a gate-contact mask individual gate contacts and etching said intermediate isolation dielectric material layer through openings of the mask until exposing the top surface of said permanent gate structures and removing said mask;

depositing a gate-contact metal layer in electrical contact with said permanent gate structures and patterning said deposited metal layer to form said gate interconnection lines parallel to the underlying isolation strips and orthogonal to said underlying drain and source interconnection lines and connecting the gate structures of the cells of a column of the array.

3. The process according to claim 1 wherein said step of forming an isolation structure among the cells of a row of said array in the form of uninterrupted isolation strips includes the steps of:

forming a masking pattern on the semiconductor substrate, the masking pattern exposing the semiconductor substrate in a plurality of parallel strips that extend uninterrupted for a selected length;

thermally growing a field oxide layer on the exposed strips of the semiconductor substrate to form a plurality of uniformly spaced and parallel strips of the field oxide layer that forms said isolation structure.

4. The process according to claim 1 wherein said step of forming an isolation structure among the cells of a row of said array in the form of uninterrupted isolation strips further includes the steps of:

forming a masking pattern on said semiconductor substrate, the masking pattern exposing the semiconductor substrate in a plurality of parallel strips that are uninterrupted for a selected length;

etching trenches into the exposed portions of the semiconductor substrate; and filling the trenches with a dielectric material to create a plurality of uninterrupted isolation strips that are uniformly spaced and parallel to each other that form the isolation structure among the cells.

5. The process according to claim 1 wherein said step of forming a partially sacrificial gate structure in the form of spaced parallel strips running orthogonal to said underlying isolation strips includes the steps of:

thermally oxidizing the semiconductor substrate to form a gate oxide on exposed areas of the substrate said exposed surfaces including a plurality of spaced, parallel strips running orthogonal to said underlying isolation strips;

depositing a first layer of polycrystalline silicon over said gate oxide;

forming a dielectric layer overlaying said polycrystalline layer for isolating the first polycrystalline layer to become a floating gate of an EPROM memory cell;

depositing a second layer of polycrystalline silicon overlaying said insulating layer such that said second layer of polycrystalline silicon becomes a control gate of an EPROM memory cell; and forming, by selective masking and etching of said first and second polycrystalline layers, to form a plurality of spaced, parallel strips running orthogonal to said silicon underlying isolation strips to form said gate structure.

6. The process according to claim 1 wherein said step of forming a partially sacrificial gate structure in the form of spaced parallel strips running orthogonal to said underlying isolation strips includes the steps of:

thermally oxidizing the semiconductor substrate to form a gate oxide on exposed surfaces of the semiconductor substrate, said exposed surfaces including a plurality of spaced, parallel strips running orthogonal to said underlying isolation strips;

depositing a first layer of polycrystalline silicon overlaying said gate oxide to form the gate structure of a simple MOS transistor; and etching said polycrystalline silicon layer in a pattern to form a plurality of spaced, parallel strips running orthogonal to said underlying isolation strips to provide said partially sacrificial gate structure in the form of a simple MOS transistor gate.

7. The process according to claim 1 wherein said step of defining by means of a gate contact mask individual gate contacts and etching said intermediate isolation dielectric materials for openings of the mask includes the steps of:

etching a contact through the gate contact mask to expose said gate structure only for selected gate structures; and connecting the gates of only selected transistors with a metal layer during said final step of depositing a gate contact metal layer.

8. The process according to claim 2 wherein said step of forming an isolation structure among the cells of an row of said array in the form of uninterrupted isolation strips includes the steps of:

forming a masking pattern on the semiconductor substrate, the masking pattern exposing the semiconductor substrate in a plurality of parallel strips that extend uninterrupted for a selected length;

thermally growing a field oxide layer on the exposed strips of the semiconductor substrate to form a plurality of uniformly spaced and parallel strips of the field oxide layer that forms said isolation structure.

9. The process according to claim 2 wherein said step of forming an isolation structure among the cells of a row of said array in the form of uninterrupted isolation strips further includes the steps of:

forming a masking pattern on said semiconductor substrate, the masking pattern exposing the semiconductor substrate in a plurality of parallel strips that are uninterrupted for a selected length;

etching trenches into the exposed portions of the semiconductor substrate; and filling the trenches with a dielectric material to create a plurality of uninterrupted isolation strips that are uniformly spaced and parallel to each other that form the isolation structure among the cells.

10. The method according to claim 2 wherein said step of forming a partially sacrificial gate structure in the form of spaced parallel strips running orthogonal to said underlying isolation strips includes the steps of:

thermally oxidizing the semiconductor substrate to form a gate oxide on exposed areas of the substrate said exposed surfaces including a plurality of spaced, parallel strips running orthogonal to said underlying isolation strips;

depositing a first layer of polycrystalline silicon over said gate oxide;

forming a dielectric layer overlaying said polycrystalline layer for isolating the first polycrystalline layer to become a floating gate of an EPROM memory cell;

depositing a second layer of polycrystalline silicon overlaying said insulating layer such that said second layer of polycrystalline silicon becomes a control gate of an EPROM memory cell; and forming, by selective masking and etching of said first and second polycrystalline layers, to form a plurality of spaced, parallel strips running orthogonal to said silicon underlying isolation strips to form said gate structure.

11. The process according to claim 2 wherein said step of forming a partially sacrificial gate structure in the form of spaced parallel strips running orthogonal to said underlying isolation strips includes the steps of:

thermally oxidizing the semiconductor substrate to form a gate oxide on exposed surfaces of the semiconductor substrate, said exposed surfaces including a plurality of spaced, parallel strips running orthogonal to said underlying isolation strips;

depositing a layer of polycrystalline silicon overlaying said gate oxide to form the gate structure of a simple MOS transistor; and etching said polycrystalline silicon layer in a pattern to form a plurality of spaced, parallel strips running orthogonal to said underlying isolation strips to provide said partially sacrificial gate structure in the form of a simple MOS transistor gate.

12. The process according to claim 2 wherein said step of defining by means of a gate contact mask individual gate contacts and etching said intermediate isolation dielectric materials for openings of the mask includes the steps of:

etching a contact through the gate contact mask to expose said gate structure only for selected gate structures; and connecting the gates of only selected transistors with a metal layer during said final step of depositing a gate contact metal layer.

13. A process for fabricating a semiconductor device comprising the steps of:

forming strips of an isolation structure in a semiconductor substrate, the isolation structure including a plurality of parallel strips that extended for a selected distance in parallel lines;

forming a gate structure overlaying the semiconductor substrate and the isolation structure strips, the gate structure including a plurality of spaced, parallel strips that extend for a selected distance orthogonally to said strips of the isolation structure so as to overlay said strips of isolation structure at locations where the two strips cross over the same location in the substrate;

forming a planarization material overlaying the entire substrate, including the strips of isolation structure, the gate structure and the substrate to create a generally planar layer over the entire substrate;

anisotripically etching said planarization material without a mask until the portions of the layer directly below the planarization layer are exposed;

forming a gate-separation mask having selected opening therein, the selected openings extending as strips that overlay at least a portion of the strips of isolation material formed in the previous step of forming strips of isolation material and the selected openings including strips that extend orthogonally to the gate structures formed in a previous step;

etching exposed portions of the gate structure to define individual gate structures that are electrically isolated from other gate structures in the same strip;

depositing a gate-contact conductive layer in electrical contact with the individual gate structures.

14. The process according to claim 13 wherein said planarization material is a conductive layer and contacts the substrate at selected locations to provide electrical contact to the selected locations of the substrate.

15. The process according to claim 13 wherein said planarization material is an insulating layer and further including the steps of:

depositing a conductive layer on the substrate, in contact with the substrate after the strips of isolation structure and gate structures have been formed;

depositing the planarization material to overlay the conductive layer, forming an insulating layer on top of the conductive layer.

16. The process according to claim 13 in which selected gates are connected to the gate-contact conductive layer performing the following step just prior to the step of depositing the gate-contact conductive layer:

defining by means of a gate contact mask selected individual gates which are exposed through opening in the gate contact mask such that the gate-contact conductive layer electrically contacts the exposed individual gates and does not contact any individual gates that are not exposed.

17. The process according to claim 13 wherein said gate-contact conductive layer is parallel to the strips of isolation material formed in the previous step of forming strips of isolation material such that they extend in the same direction as the strips of isolation material and the gate-contact conductive layer includes strips that extend orthogonally to the gate structures and underlying drain and source interconnection lines such that a single gate-contact conductive layer electrically connects a plurality of gate structures of cells in a single column of a memory array.

* * * * *

UNITED STATES PATENT AND TRADEMARK OFFICE
CERTIFICATE OF CORRECTION

PATENT NO. : 5,279,982
DATED : January 18, 1994
INVENTOR(S) : Pier L. Crotti

It is certified that error appears in the above-identified patent and that said Letters Patent is hereby corrected as shown below:

In claim 6, column 10, line 63, after "strips" and before "includes", please insert --further--.

In claim 6, column 11, line 1, please delete "first".

In claim 8, column 11, line 21, please delete the second occurrence of "an" and substitute therefor --a--.

In claim 11, column 12, line 6, after "strips" and before "includes", please insert --further--.

Signed and Sealed this

Sixteenth Day of August, 1994

Attest:

BRUCE LEHMAN

*Attesting Officer*   *Commissioner of Patents and Trademarks*